(12) United States Patent
Hakkers

(10) Patent No.: US 11,378,742 B2
(45) Date of Patent: Jul. 5, 2022

(54) VISUAL REPRESENTATION OF DIFFERENT STRUCTURE PORTS IN SCHEMATICS OF PHOTONIC INTEGRATED CIRCUITS

(71) Applicant: Synopsys, Inc., Mountain View, CA (US)

(72) Inventor: Thomas Hakkers, Overijssel (NL)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/116,594

(22) Filed: Dec. 9, 2020

(65) Prior Publication Data

US 2021/0181414 A1 Jun. 17, 2021

(30) Foreign Application Priority Data

Dec. 17, 2019 (EP) .................................... 19217186

(51) Int. Cl.
*G06F 30/39* (2020.01)
*G02B 6/122* (2006.01)
*G02B 6/12* (2006.01)

(52) U.S. Cl.
CPC ....... *G02B 6/1225* (2013.01); *G02B 6/12002* (2013.01); *G02B 6/12004* (2013.01); *G02B 2006/1213* (2013.01); *G06F 30/39* (2020.01)

(58) Field of Classification Search
CPC .. G06F 2112/12; G06F 30/39; G02B 27/0012
See application file for complete search history.

(56) References Cited

U.S. PATENT DOCUMENTS

| | | | |
|---|---|---|---|
| 9,684,761 B1 * | 6/2017 | Lamant | G06F 30/398 |
| 10,650,110 B2 * | 5/2020 | Van Vaerenbergh | G06F 30/39 |
| 10,860,603 B2 * | 12/2020 | Dilts | G06F 16/26 |
| 2012/0227024 A1 * | 9/2012 | Uppaluri | G06F 30/33 716/112 |

\* cited by examiner

*Primary Examiner* — Charlie Y Peng
(74) *Attorney, Agent, or Firm* — Fenwick & West LLP

(57) ABSTRACT

In one aspect, a method for displaying incompatible ports at the schematic design stage comprises the following. A schematic of a photonic integrated circuit is accessed. The schematic comprises a plurality of optical components that have ports, and the optical components are connected at their ports. A processor determines the structures of the ports. Typically, the structure of a port is determined by the cross-sectional shape and the material(s) of the port. The schematic of the photonic integrated circuit is displayed, with different visual indicators for ports with different structures. For example, ports with different structures may be represented by symbols of different colors, different outlines, different fill patterns or other types of non-textual visual indicators.

20 Claims, 7 Drawing Sheets

VISUAL REPRESENTATION OF DIFFERENT STRUCTURE PORTS IN SCHEMATICS OF PHOTONIC INTEGRATED CIRCUITS

CROSS REFERENCE TO RELATED APPLICATIONS

This application claims the right of priority based on EP application Ser. No. 19217186.6, filed Dec. 17, 2019, which is incorporated by reference in its entirety.

TECHNICAL FIELD

The present disclosure relates to displaying schematics of photonic integrated circuits.

BACKGROUND

In order to design a photonic integrated circuit, a designer typically first creates a schematic of the design. The schematic includes optical components with ports. A port can be a connection point for a component and a component can have multiple ports. A schematic of a photonic integrated circuit is then comprised of optical components, which are connected to each other through their ports. Using this representation, the designer can simulate how the photonic integrated circuit will behave before they determine the physical layout of the circuit. The schematic representation is often used to then construct the physical layout of the photonic integrated circuit.

SUMMARY

In one aspect, a method for displaying incompatible ports at the schematic design stage comprises the following. A schematic of a photonic integrated circuit is accessed. The schematic comprises a plurality of optical components that have ports, and the optical components are connected at their ports. A processor determines the structures of the ports. Typically, the structure of a port is determined by the cross-sectional shape and the material(s) of the port. The schematic of the photonic integrated circuit is displayed, with different visual indicators for ports with different structures. For example, ports with different structures may be represented by symbols of different colors, different outlines, different fill patterns or other types of non-textual visual indicators.

Other aspects include components, devices, systems, improvements, methods, processes, applications, computer readable mediums, computing devices with displays and other technologies related to any of the above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
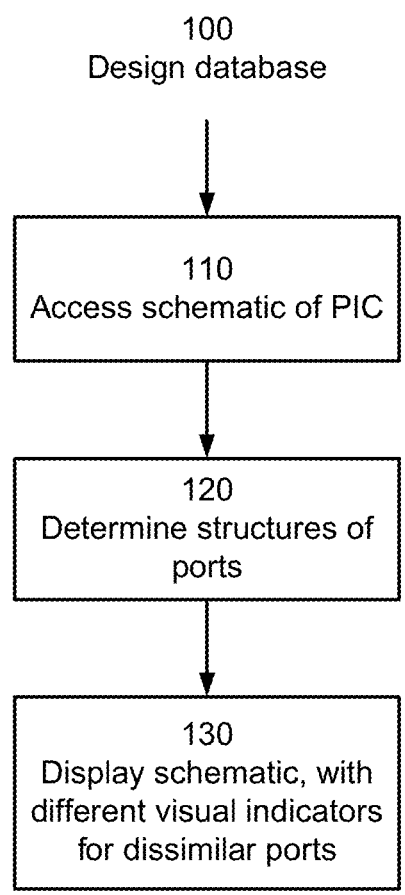
FIG. 1 depicts a flow diagram for displaying a schematic of a photonic integrated circuit, in accordance with some embodiments of the present disclosure.

Aspects of the present disclosure relate to visual representation of ports with different structures in schematics of photonic integrated circuits (PICs). In a photonic integrated circuit (also referred to as an integrated optical circuit), different optical components are integrated onto a substrate. The optical components can be either active or passive. Examples of optical components include power splitters, optical amplifiers, optical modulators, filters, lasers and detectors. Photonic integrated circuits are fabricated using semiconductor fabrication techniques, such as lithography, etching and deposition. Examples of PICS include different types of lasers, receivers, modulators (e.g., Mach-Zehnder modulator) and also passive devices. Materials systems for PICS include indium phosphide, gallium arsenide, and silica, for example. Operating wavelengths commonly may include the visible and near infrared.

In photonic integrated circuits, the optical signals are routed between the components using waveguide structures. In a schematic representation, the connection points for an optical component are represented by ports. One complication with photonic integrated circuits is that ports can have incompatible structures—different cross sectional shapes and made from different materials—resulting in different waveguiding properties. Connecting components via incompatible ports can result in unacceptable effects when converting the schematic to a physical layout. For example, this type of connection can result in unacceptable losses, back reflection and cross talk. A warning message may be generated if incompatible ports are connected in a physical layout, but the warning message does not appear until the physical layout stage. In addition, if the schematic is large, making the changes required to ensure all ports are compatible can take a long time. One of the reasons is that changing the structure of the port for one component may result in having to change the structures of the ports for all of the components that follow. This can take a long time to resolve, increasing the cost of the design effort.

Special components, referred to as transition components, may be used to transition from a port with one structure to another port with a different structure. Connecting two ports with different structures without the use of a transition component may cause the photonic integrated circuit to behave differently than intended. However, in current representations of a schematic design, such problems are not easily discovered, which can then lead to problems in the physical layout that take time to resolve, increasing the cost.

In one embodiment, visual indicators, such as color, are used to identify the structure of ports. For example, ports with the same cross-sectional shape and material may be represented by symbols of the same color, and ports of different shapes and materials represented by different colors. This allows designers to conveniently and easily recognize which ports are compatible and may be directly connected, versus which are incompatible and will require a transition component for efficient connection. The visual indicators allow the designer to see this information even when the schematic is large and the display of the schematic is zoomed out. This can save time in the schematic design phase, because the indication of incompatible ports is readily available during the schematic design phase rather than being discovered later in the physical layout stage. Furthermore, less computing resources can be used for the design of a photonic integrated circuit as the designer may transition from the schematic phase to the layout phase more quickly, as the visual indicators can assist with the connections between ports from different components.

FIG. 1 depicts a flow diagram for displaying a schematic of a photonic integrated circuit, in accordance with some embodiments of the present disclosure. A design database 100 contains a description of a schematic of a photonic integrated circuit (PIC). The PIC includes a plurality of interconnected optical components. In a schematic representation, the components have ports (i.e., connection points) and the components are connected at their ports. A processor accesses 110 the schematic and determines 120 the structures of the ports in the schematic.

The structure of a port may be determined by its cross-sectional shape and its material(s), including any internal structure. Two ports that have the same cross-sectional shape and material have the same structure. They are compatible and may be directly connected with each other. Conversely, ports with different cross-sectional shapes or different materials are dissimilar. The designer would consider whether they may be directly connected with each other despite the dissimilarity or whether a transition component is inserted to bridge the dissimilar ports.

The port structures may be specified in different ways within the design database 100. In one approach, the physical structure of the port is described: dimensions and shapes of the port cross-section and materials used. Alternatively, there may be a limited number of port structures which are given labels: port structure A, port structure B, etc. The set of possible port structures may be defined by the user or may be predefined in the design software or set by accepted standards or by the foundry that will manufacture the PIC. In yet another approach, port compatibility may be described by their transmission characteristics: single mode vs multi-mode, specific mode structure, and polarization characteristics, for example.

The display of the schematic includes visual indicators 130 of the structure of the ports. Dissimilar ports may be marked by different visual indicators (e.g., different colors), while compatible ports may be marked by the same visual indicators (e.g., same colors). Other examples of visual indicators include different fill patterns, different outlines or line types, and different symbols. The visual indicators may include a non-textual element since there may be a large number of ports and it may become cluttered if every port were labeled with text. Thus, if two ports are connected to each other but are incompatible, the designer can determine this from their different visual indicators.

In an alternative approach, rather than marking ports with visual indicators, the connections are marked. A connection between incompatible ports might be marked with one visual indicator, for example a red x or a red triangle with the tip pointing to the port with smaller cross section and base towards the port with larger cross section. A connection between compatible ports might be marked with a different visual indicator, for example a green circle. No indicator might also be used to indicate compatible ports, so that only incompatibility is marked in the schematic.

Figure 2A:
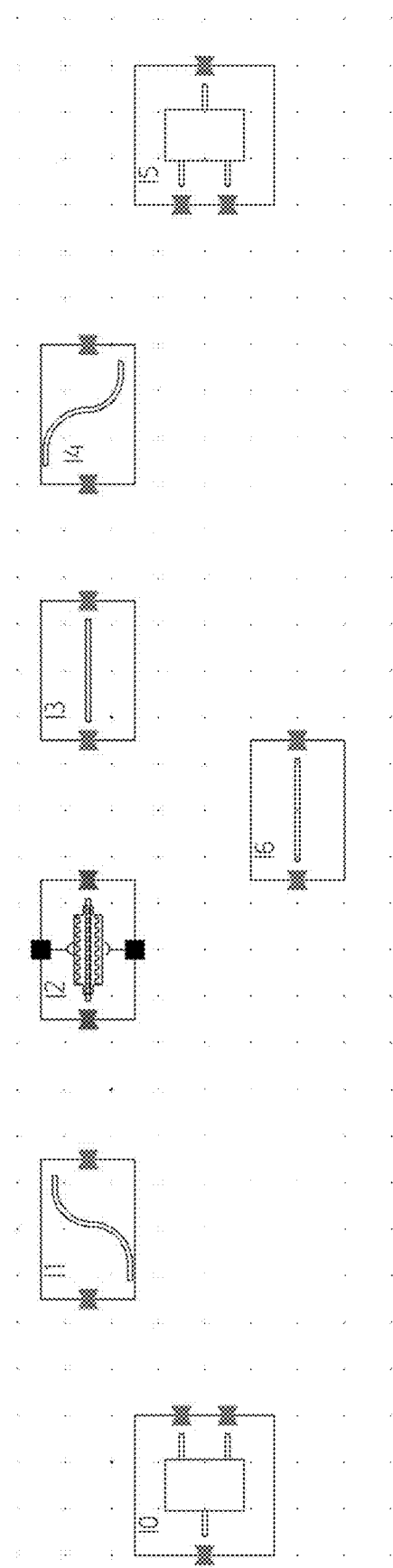
FIGS. 2A-2C depict screen shots of a schematic of a simple photonic integrated circuit, in accordance with some embodiments of the present disclosure.
Figure 2B:
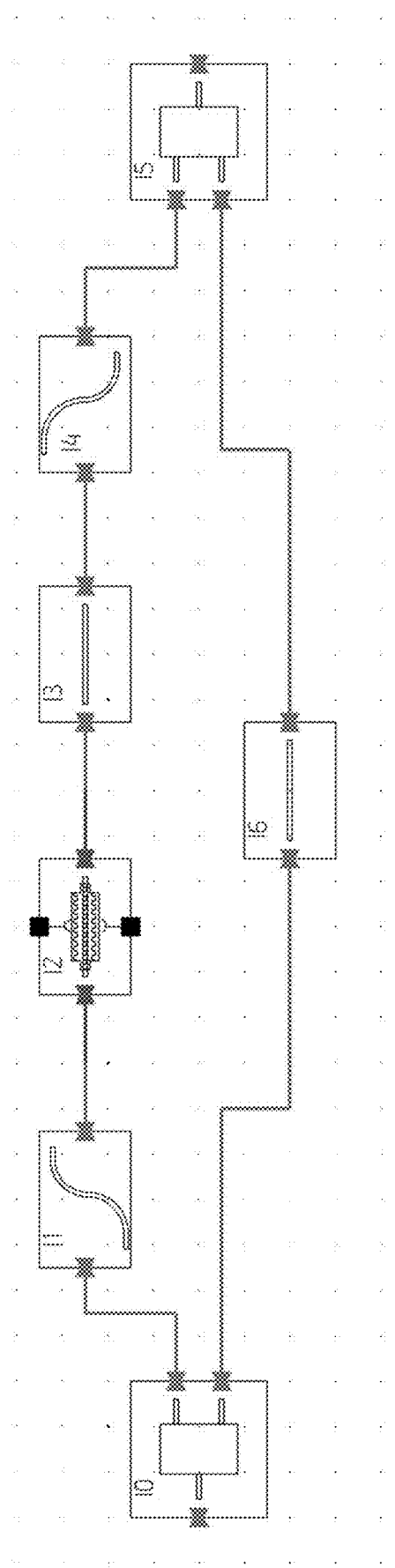
Figure 2C:
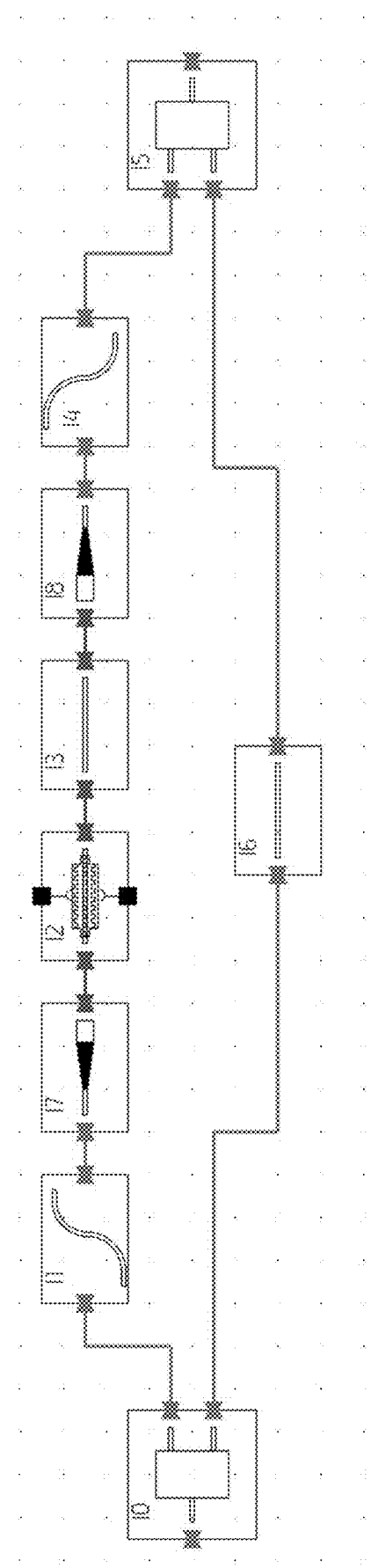

FIGS. 2A-2C depict screen shots of a schematic of a simple photonic integrated circuit, in accordance with some embodiments of the present disclosure. In these schematics, each box with black outline is a component and the symbol inside the black box identifies the type of component. Each component is also labeled. The ports of the components are indicated by the red and green symbols on the border of the black box, where red and green indicate different structures for the ports. In FIG. 2A, the components are shown without connection. The components are as follows: I0: optical splitter, I1: curved waveguide, I2: electro-optic modulator (applying electrical signal changes optical path length through the component), I3: straight waveguide, I4: curved waveguide, I5: optical combiner, I6: straight waveguide.

In FIG. 2B, the components are connected to form a Mach-Zehnder modulator. The electro-optic modulator I2 modulates the relative phase of the optical paths through the two arms. Thus, the optical signals from the two arms interfere constructively or destructively at the combiner I5. In the schematic of FIG. 2B, the electro-optic modulator I2 is an active element and uses a port with one structure, as indicated by the red port symbol. All of the other elements are passive and use a port with a different structure, as indicated by the green port symbol. The port incompatibility is apparent where red and green clash.

In FIG. 2C, the port incompatibility is resolved as follows. The straight waveguide I3 is replaced by a straight waveguide that is compatible with the electro-optic modulator I2. Transition components I7 and I8 are added to bridge between the two different structure ports (red and green). Note that the color also adds information for various components. For example, the straight waveguides I3 and I6 are represented by the same symbol, but they are not identical because they have different structures. The different structures are apparent from the colored ports, but otherwise this difference would not be apparent.

These visual indicators are also useful for highlighting transition components. Sometimes a designer has no choice but to connect two incompatible ports, meaning light will have to go from one structure to another. Because doing so directly would usually result in unwanted effects, a transition component is used to bridge from one port configuration to the other. These transition components, however, typically create unwanted losses in the circuit despite routing the light properly. Highlighting ports based on their structures can help the designer see whether the circuit has many transitions, which can help in finding locations in the schematic that have losses. In addition, a single symbol may be used to represent all types of transition components, regardless of which ports are bridged. This can make it difficult to differentiate between different types of transition components. Therefore, highlighting ports based on their configuration also helps to differentiate between different types of transition components, such as components I7 and I8 in FIG. 2C.

Figure 3:
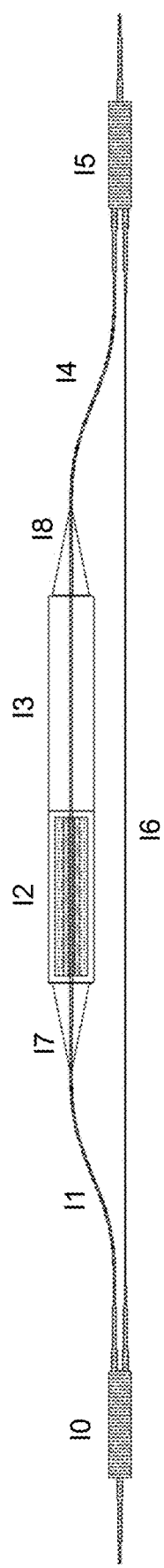
FIG. 3 depicts a screen shot of a physical layout of the schematic shown in FIG. 2.

FIG. 3 depicts a screen shot of a physical layout of the schematic shown in FIG. 2C. The physical structures in FIG. 3 are labelled I0-I8 according to the corresponding components I0-I8 in FIG. 2C.

Figure 4:
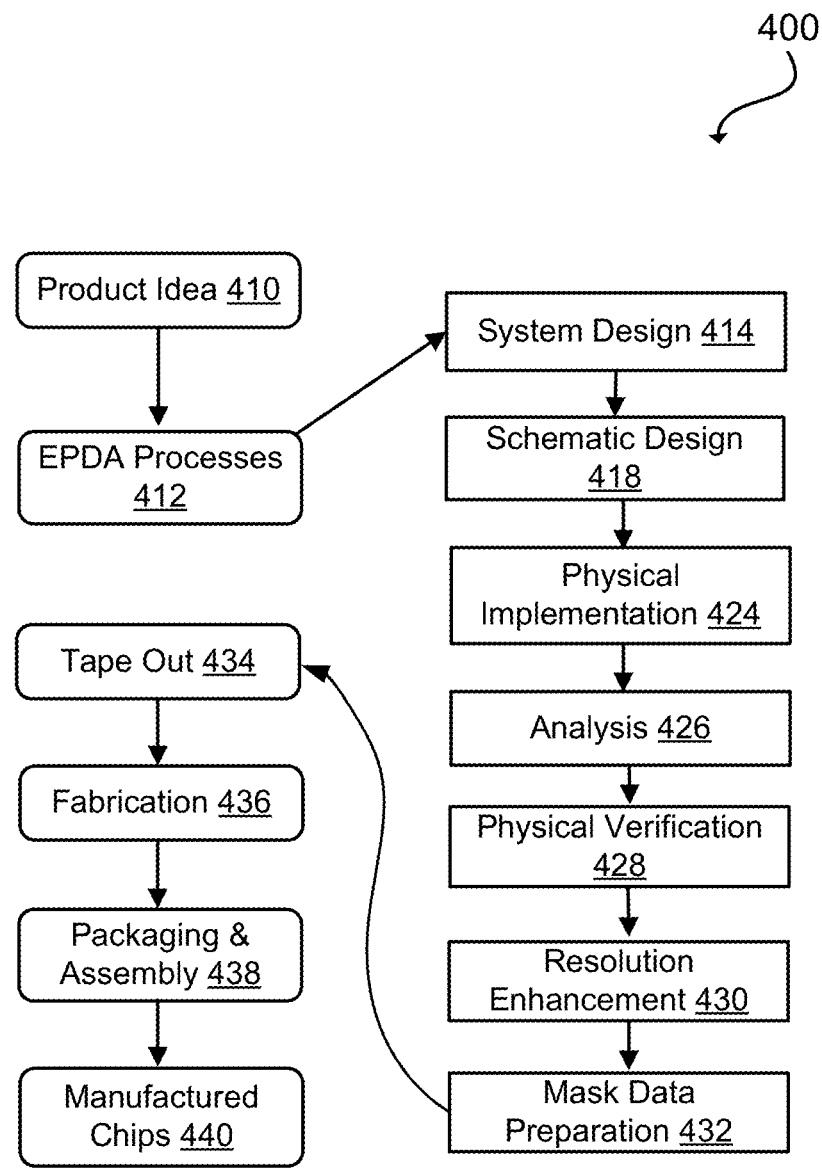
FIG. 4 depicts a flowchart of various processes used during the design and manufacture of a photonic integrated circuit in accordance with some embodiments of the present disclosure.

FIG. 4 illustrates an example set of processes 400 used during the design, verification, and fabrication of a photonic integrated circuit (PIC) to transform and verify design data and instructions that represent the PIC. Each of these processes can be structured and enabled as multiple modules or operations. The term 'EPDA' signifies the term 'Electronic Photonic Design Automation.' These processes start with the creation of a product idea 410 with information supplied by a designer, information which is transformed to create an article of manufacture that uses a set of EPDA processes 412. When the design is finalized, the design is taped-out 434, which is when artwork (e.g., geometric patterns) for the PIC is sent to a fabrication facility to manufacture the mask set, which is then used to manufacture the PIC. After tape-out, a die is fabricated 436 and packaging and assembly processes 438 are performed to produce the finished photonic integrated circuit 440.

Specifications may range from lower-level material and physical layouts to higher-level descriptions. Higher level descriptions can be transformed to lower level descriptions: product specifications to schematic to physical layout to mask-level descriptions, for example. Each lower abstraction level that is a less abstract description adds more useful detail into the design description, for example, more details for the modules that include the description. The lower levels of abstraction that are less abstract descriptions can be generated by a computer, derived from a design library, or created by another design automation process. Descriptions at each level of abstraction are enabled for use by the corresponding tools of that layer. A design process may use a sequence depicted in FIG. 4. The processes described may be enabled by EPDA products (or tools), although the steps in FIG. 4 focus on the photonic design steps.

During system design 414, functionality of a PIC to be manufactured is specified. The design may be optimized for desired characteristics such as power consumption, performance, area (physical and/or lines of code), and reduction of costs, etc. Partitioning of the design into different types of modules or components can occur at this stage.

During schematic design 418, higher level descriptions may be transformed to a netlist of components. In some embodiments, a netlist may be a graph structure where edges of the graph structure represent components of the PIC and where the nodes of the graph structure represent how the components are interconnected.

During layout or physical implementation 424, physical placement (positioning of circuit components such as described above) and routing (connection of the circuit components by waveguides) occurs.

During analysis 426, the circuit function is verified at the physical layout level, which permits refinement of the schematic and/or layout designs. During physical verification 428, the physical layout design is checked to ensure that manufacturing constraints are correct. During resolution enhancement 430, the geometry of the layout may be transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished PICs.

A storage subsystem of a computer system (such as computer system 500 of FIG. 5) may be used to store the programs and data structures that are used by some or all of the EPDA products described herein, and products used for development of cells for the library and for physical and logical design that use the library.

Figure 5:
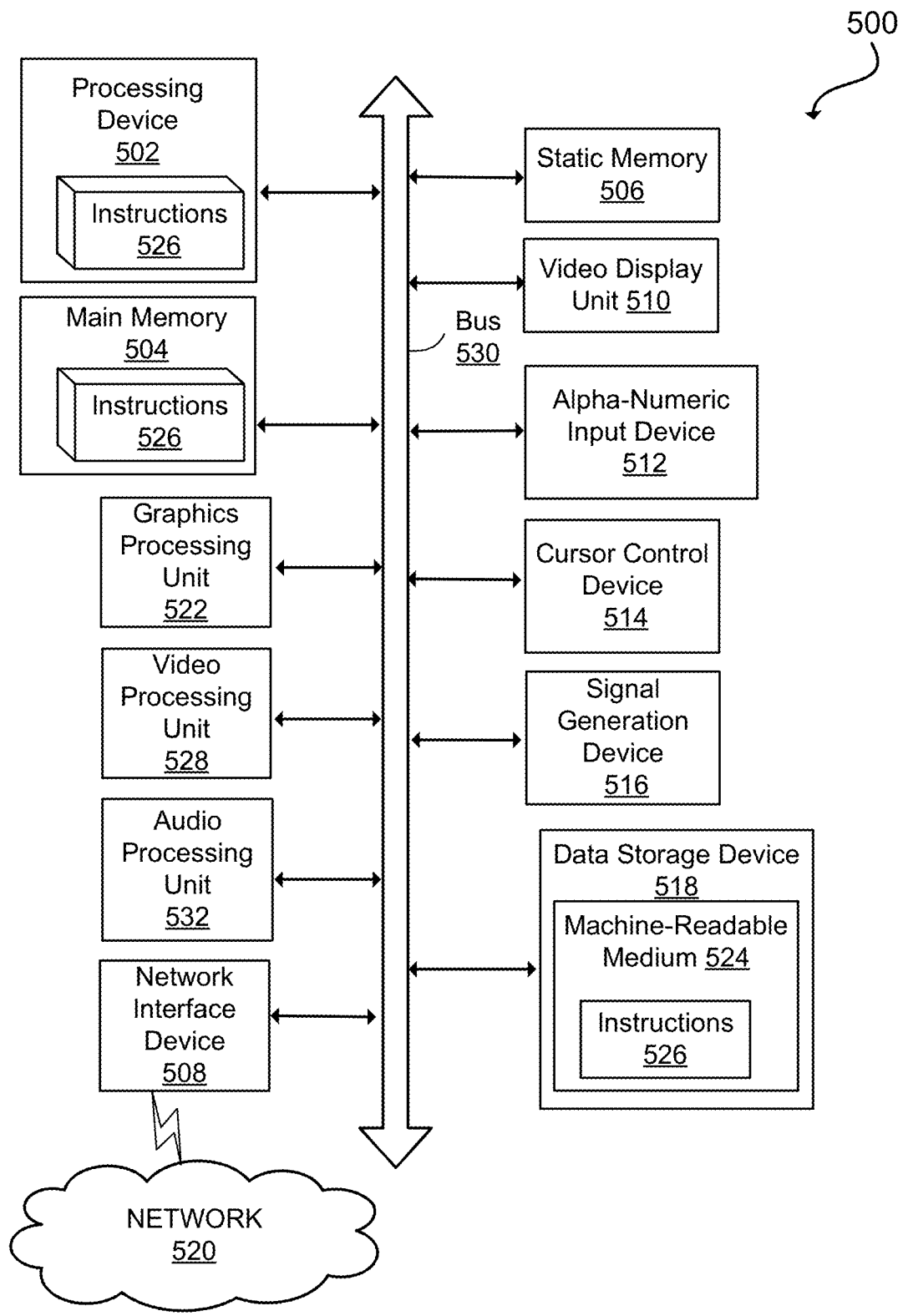
FIG. 5 depicts an abstract diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing a schematic of a photonic integrated circuit, wherein the schematic comprises aplurality of optical components that have ports and the optical components are connected at the ports;
   determining, by a processor, structures of the ports; and
   providing the schematic with visual indicators for the ports based on the determined structures of the ports, wherein the ports with different structures are associated with different visual indicators.

2. The method of claim 1 wherein providing the schematic further comprises providing the same visual indicator for ports with the same structure.

3. The method of claim 1 wherein the structures of the ports include cross-sectional shapes of the ports.

4. The method of claim 1 wherein the structures of the ports include materials comprising the ports.

5. The method of claim 1 wherein providing the schematic comprises providing symbols of different colors for the ports with the different structures.

6. The method of claim 1 wherein providing the schematic comprises providing symbols with different fill patterns and/or different outlines for the ports with the different structures.

7. The method of claim 1 wherein the visual indicators are non-textual.

8. The method of claim 1 wherein the optical components comprise transition components that transition between the ports with the different structures.

9. The method of claim 8 wherein the visual indicators indicate which of the transition components have the same structure.

10. The method of claim 1 wherein the schematic does not distinguish whether the ports are input ports or output ports.

11. A non-transitory computer readable medium comprising stored instructions, which when executed by a processor, cause the processor to:
   access a schematic of a photonic integrated circuit, the schematic comprising a plurality of connected optical components, wherein the optical components have ports and the optical components are connected at the ports;
   determine structures of the ports; and
   provide the schematic with visual indicators for the ports based on the determined structures of the ports, wherein the ports with different structures are associated with different visual indicators.

12. The non-transitory computer readable medium of claim 11 wherein the structures of the ports include cross-sectional shapes of the ports and materials comprising the ports.

13. The non-transitory computer readable medium of claim 11 wherein providing the schematic comprises providing symbols of different colors for the ports with the different structures.

14. The non-transitory computer readable medium of claim 11 wherein providing the schematic comprises providing symbols with different fill patterns and/or different outlines for the ports with the different structures.

15. The non-transitory computer readable medium of claim 11 wherein the optical components comprise transition components that transition between the ports with the different structures, and the visual indicators indicate which of the transition components have the same structure.

16. A system comprising:
a memory storing instructions; and
a processor, coupled with the memory and to execute the instructions, the instructions when executed cause the processor to:
access a schematic of a photonic integrated circuit, the schematic comprising a plurality of connected optical components, wherein the optical components have ports and the optical components are connected at the ports;
determine structures of the ports; and
provide the schematic with visual indicators for the ports based on the determined structures of the ports, wherein the ports with different structures are associated with different visual indicators.

17. The system of claim 16 wherein the structures of the ports include cross-sectional shapes of the ports and materials comprising the ports.

18. The system of claim 16 wherein the visual representation of the schematic comprises symbols of different colors for the ports with the different structures.

19. The system of claim 16 wherein the visual representation of the schematic comprises symbols with different fill patterns and/or different outlines for the ports with the different structures.

20. The system of claim 16 wherein the optical components comprise transition components that transition between the ports with the different structures, and the visual indicators indicate which of the transition components have the same structure.

* * * * *